(12) United States Patent
Schultz et al.

(10) Patent No.: US 8,848,847 B2
(45) Date of Patent: Sep. 30, 2014

(54) SAMPLING RECEIVER WITH INHERENT MIXER FUNCTIONALITY

(75) Inventors: Christoph Schultz, Essen (DE); Markus Hammes, Dinslaken (DE); Rainer Kreienkamp, Duesseldorf (DE)

(73) Assignee: Intel Mobile Communications GmbH, Neubiberg (DE)

( * ) Notice: Subject to any disclaimer, the term of this patent is extended or adjusted under 35 U.S.C. 154(b) by 139 days.

(21) Appl. No.: 13/443,394

(22) Filed: Apr. 10, 2012

(65) Prior Publication Data

US 2013/0266101 A1     Oct. 10, 2013

(51) Int. Cl.
*H04B 1/10*     (2006.01)

(52) U.S. Cl.
USPC ........... 375/350; 375/316; 375/324; 455/144; 455/214; 455/266; 455/307; 455/324; 455/334; 329/317; 708/313

(58) Field of Classification Search
CPC .......... H04B 1/16; H04B 1/0014; H04B 1/26; H04B 1/0003; H04B 1/0039; H03H 17/02; H03H 17/06; H03H 17/0275; H03H 17/0657; H03D 7/00

USPC .......... 375/316, 324, 350; 455/144, 214, 266, 455/307, 324, 334; 329/317; 708/313
See application file for complete search history.

(56) References Cited

U.S. PATENT DOCUMENTS

| 5,732,337 A * | 3/1998 | Wargnier et al. ............... 455/144 |
| 7,047,264 B2 * | 5/2006 | Kishi ............................ 708/313 |
| 7,386,581 B2 | 6/2008 | Zirkle |
| 2007/0217497 A1 | 9/2007 | Takahashi et al. |

* cited by examiner

*Primary Examiner* — Leon Flores
(74) *Attorney, Agent, or Firm* — Eschweiler & Associates, LLC

(57) ABSTRACT

One embodiment of the present invention relates to a combined mixer filter circuit. The circuit includes a sampler, a plurality of filter branches, and a coefficient generator. The sampler is configured to provide a sampled signal by sampling a received signal at a specified rate. The plurality of filter branches has selectable filter coefficients. The plurality of filter branches are configured to receive the sampled signal and generate a mixed and filtered output signal without a separate mixer component. The coefficient generator is coupled to the plurality of filter branches. The coefficient generator is configured to assign filter coefficient values to the selectable filter coefficients to yield a selected mixing function for the mixed filtered output signal.

19 Claims, 10 Drawing Sheets

SAMPLING RECEIVER WITH INHERENT MIXER FUNCTIONALITY

BACKGROUND

Communication systems utilize transmitters and receivers to transfer information. The information to be communicated can be for various types of communication including, but not limited to, FM radio, AM, cellular, Bluetooth, and the like.

The transmitter performs one or more modulation techniques to generate a transmitted signal over a carrier wave that carries the information. The carrier wave is at an RF frequency. At the other end, the receiver, such as a sampling receiver, samples the data at a suitable rate and recovers the original data. There are several factors of importance relative to the communication such as bandwidth, sampling frequency, channel, noise, and the like.

DETAILED DESCRIPTION

The present invention includes methods and systems related to a sampling receiver with inherent mixer functionality in the discrete time domain. These include utilizing a time-variant FIR filter in a direct-sampling receiver to realize complex filter functions. One such function is to incorporate mixing functionality into the FIR filter.

Sampling receivers utilize filtering and mixing in order to process received signals. A finite impulse response (FIR) filter is a filter whose impulse response to a finite input is of finite duration. The impulse response lasts for a given number of samples (N+1) and then settles to zero. An infinite impulse response (IIR) filter is a filter whose impulse response is non-zero over an infinite length of time. The IIR impulse response typically decays over time. A mixer can be used to scale and modify samples according to some formula or value. This formula or value can be relatively fixed or time varying.

One example of a sampling receiver utilizes a SC filter and a first order infinite impulse response (IIR) filter. The SC filter is designed as an MA-FIR filter. This leads to a low pass (LP) filter function around DC and a symmetrical bandpass (BP) around or at a sample frequency. The IIR filter is the main contributor for far away suppression, thus, the bandwidth by this type of receiver is strictly limited. Essentially, the sample frequency is required to be at or about a carrier frequency of the receivable or received RF signal, which is a significant limitation. Another example is a Low intermediate frequency (IF) approach. However, this also faces the limitation that the sample frequency is required to be at or about the carrier frequency. This is particularly problematic if bandwidth is increased or if multiple channels are use the same frequency, such as is the case for GPS/Glonass (global navigation satellite system). For example, a problem can occur of both bands are downconverted in a single step to a single intermediate frequency (IF).

Frequency modulation (FM) radio also faces an addition problem that architectures often utilize a local oscillator (LO) frequency of about 100 MHz. This leads to harmonics in the RF bands of other standards. This problem can be simplified and addressed by choosing a fixed LO frequency. However, this increases the to-be-processed bandwidth as a final downconversion and filtering may need to be performed in digital.

A second downconversion performed in the time-discrete realm can be utilized before analog to digital conversion (ADC) in order to relax bandwidth requirements. The signal can be mixed with a rectangular discrete signal in order to mitigate at least some of the above mentioned limitations and drawbacks. Another approach combines an N-tap MA-FIR decimation filter with a discrete mixing of LO/N. Typically, N is equal to 4 or 6. This approach yields selectable, well defined frequencies.

Figure 1A:
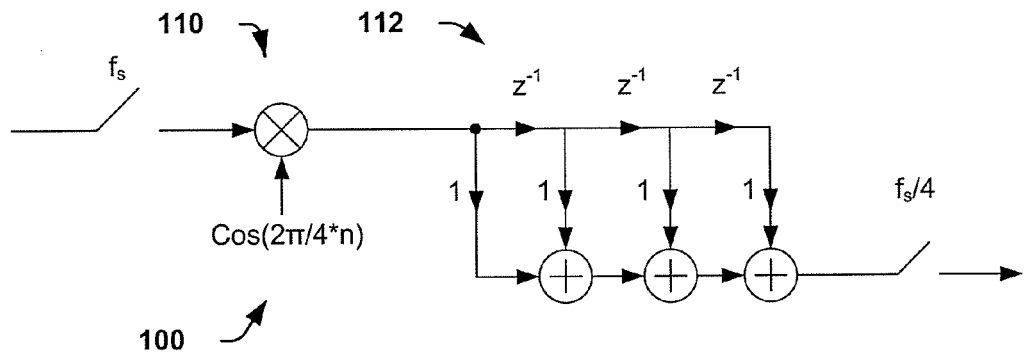
FIG. 1A is a diagram of a mixer and a FIR filter circuit.
Figure 1B:
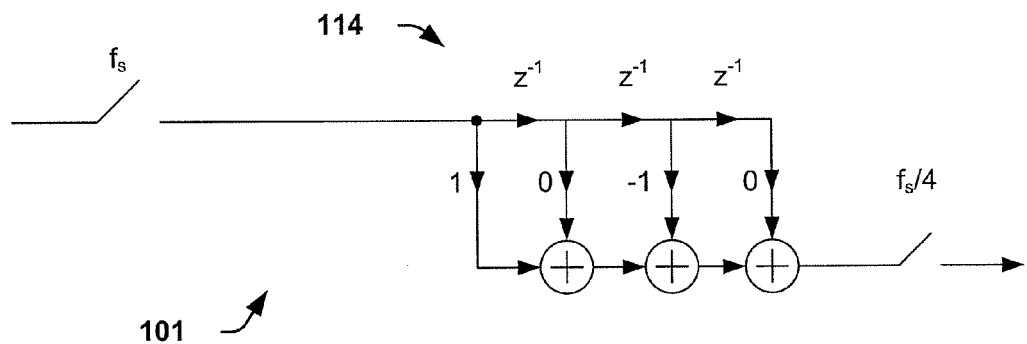
FIG. 1B is another diagram of a mixer and a FIR filter circuit.
Figure 1C:
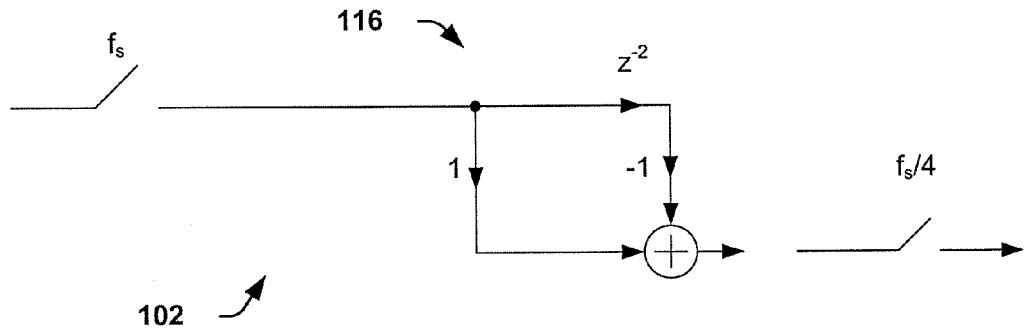
FIG. 1C is another diagram of a combined mixer and filter circuit.

FIGS. 1A-1C provide examples of various techniques to combine mixer functionality with a FIR filter for LO/4 mixing. The mixer functionality is to provide LO/4 mixing and a 4 tap FIR filter. The examples provide a second down-conversion in the time discrete realm, which can be used to relax bandwidth requirements.

FIG. 1A is a first diagram of a mixer and a FIR filter circuit 100. The circuit 100 includes a sampler $f_s$, a separate mixer 110 and a FIR filter 112. The sampler $f_s$ obtains samples of an incoming signal. The samples are mixed by the mixer 110 with a function to down-convert the signal. The mixer 110, in this example, mixes the incoming signal with cos $(2\pi/4*n)$. The down-converted signal is an output of the mixer 110 and is then received by the FIR filter 112.

The FIR filter 112 is a 4 tap filter in this example. Thus, the filter 112 has 4 branches or taps. There is a sequence of 3 unit delays designated by $z^{-1}$ operators (in Z-transform notation). There are 4 filter coefficients or tap weights that makeup the impulse response of the filter 112. In this example, the filter coefficients are 1. An output for each tap is added to a previous tap output by an adder. Thus, an output signal is generated that is a moving average of the incoming signal at $f_s/4$.

FIG. 1B is a second diagram of a mixer and a FIR filter circuit 101. The circuit 101 includes a sampler $f_s$, a FIR filter 114. It is noted that a separate mixer is not present in this example because the mixing functionality is performed as part of the FIR filter 114, which can be done because the mixing signal has a periodicity of 4, which equals the FIR length and decimation factor.

The sampler $f_s$ obtains samples of an incoming signal. The sampled signal is then provided to the FIR filter 114. In this example, the FIR filter is a 4 tap filter and has 4 branches or taps. There is a sequence of 3 unit delays designated by $z^{-1}$ operators (in Z-transform notation). There are 4 filter coefficients or tap weights that makeup the impulse response of the filter 114. Instead of utilizing a separate mixer, the filter coefficients are adjusted or modified to perform this second mixing. Here, a first filter coefficient is set to 1, a second filter coefficient is set to 0, a third filter coefficient is set to −1, and a fourth filter coefficient is set to 0. An output for each tap is added to a previous tap output by an adder. Thus, an output signal is generated that is a moving average of the incoming signal at $f_s/4$. The output signal is identical to the output signal provided by the circuit 100 of FIG. 1A. The values set for the filter coefficients perform the same function as the mixer (cos (2π/4*n)). Thus, the filter 114 includes integrated mixing functionality.

It is noted that the second and fourth branches have coefficient values of 0. As a result, the branches do not contribute to the output signal and can be removed, further simplifying the circuit.

FIG. 1C is a third diagram of a mixer and a FIR filter circuit 102. The circuit 102 includes a sampler $f_s$, a FIR filter 116. It is noted that a separate mixer is not present in this example because the mixing functionality is performed as part of the FIR filter 116.

The sampler $f_s$ obtains samples of an incoming signal. The sampled signal is then provided to the FIR filter 116. In this example, the FIR filter is effectively a 4 tap filter, but only has two branches or taps. There is a sequence of 1 unit delay designated by $z^{-2}$ operator (in Z-transform notation). The $z^{-2}$ operator corresponds to the third brand of FIG. 1B and is merely a combination of two by $z^{-1}$ operations or unit delays.

There are only 2 filter coefficients or tap weights instead of the 4 utilized in circuit 101. The branches corresponding to filter coefficients having filter values of 0 have been removed. Thus, the second and fourth branches of the circuit 101 have been omitted in this circuit 102.

Instead of utilizing a separate mixer as in FIG. 1A, the filter coefficients are adjusted or modified to perform this second mixing. Here, a first filter coefficient is set to 1, a second filter coefficient is set to 0, a third filter coefficient is set to −1, and a fourth filter coefficient is set to 0. However, the second and fourth branches are omitted as being unnecessary due to the 0 value for the filter coefficients.

An output for each tap is added to a previous tap output by an adder. It is noted that here, there are only two taps or branches to add together because the taps/branches corresponding to the filter coefficients set to 0 have been omitted in circuit 102. Thus, an output signal is generated that is a moving average of the incoming signal at $f_s/4$. The output signal is identical to the output signal provided by the circuit 100 of FIG. 1A and the circuit 101 of FIG. 1B. The values set for the filter coefficients perform the same function as the mixer (cos (2π/4*n)). As a result, the filter 116 includes integrated mixing functionality.

It is noted that the circuit 102 is simpler than circuit 101 and much simpler than circuit 100. As a result, the complexity and components required to implement are similarly reduced.

Figure 2:
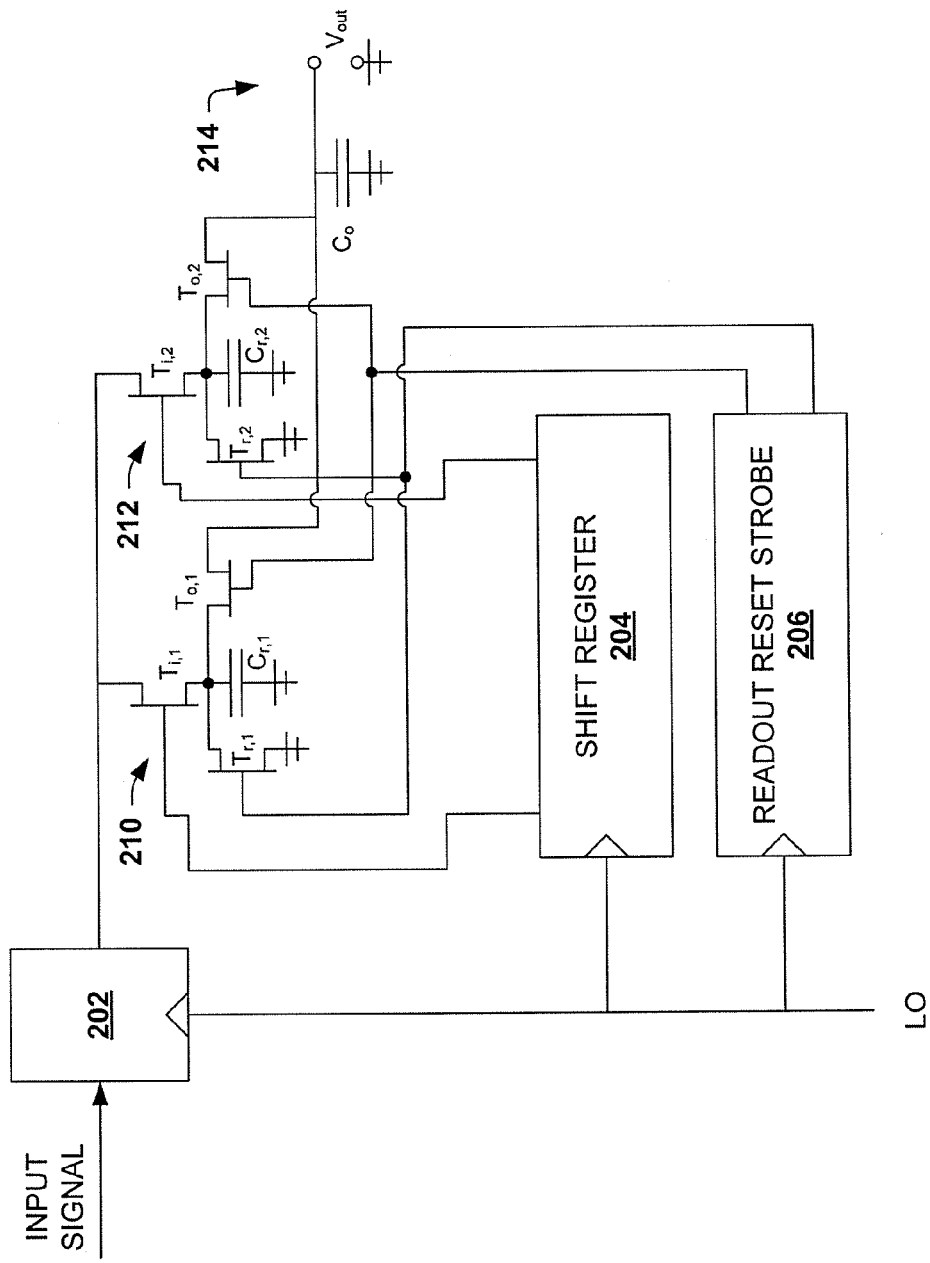
FIG. 2 is a circuit diagram illustrating a circuit for a combined mixer and filter.

FIG. 2 is a circuit diagram illustrating a possible implementation circuit 200 of a mixing decimation filter. The circuit 200 is provided as an example and receives an input signal and generates an output signal of LO/4. The circuit 200 can be utilized to implement the filter of FIG. 1C.

The circuit 200 includes an input sampler 202, a shift register 204, a readout and reset strobe 206, a first branch 210, a second branch 212, and an output terminal 214.

The input sampler 202, the shift register 204 and the strobe 206 are clocked on a local oscillator signal (LO). The input sampler 202 samples the input signal according to the LO and provides samples to the first and second branches 210 and 212. The shift register 204 provides shift signals to the first and second branches 210 and 212. The strobe 206 provides strobe signals to the first and second branches 210 and 212.

The first branch 210 corresponds to the first branch of FIG. 1C and receives the samples without delay and generates a first component of an output signal. The first branch 210 includes an input transistor $T_{i,1}$, a rotating transistor $T_{r,1}$, a rotating capacitor $C_{r,1}$ and an output transistor $T_{o,1}$. The shift signal is received by the input transistor. The strobe signals are provided to the rotating transistor and the output transistor.

The second branch 212 corresponds to the second branch of FIG. 1C and receives the samples and generates a second component of the output signal. The second branch 212 includes an input transistor $T_{i,2}$, a rotating transistor $T_{r,2}$, a rotating capacitor $C_{r,2}$ and an output transistor $T_{o,2}$. The shift signal is received by the input transistor. The strobe signals are provided to the rotating transistor and the output transistor.

The first and second components are combined and provided at the output terminal 214. An output capacitor $C_o$ is connected to the output terminal 214.

As a result, the output terminal provides the output signal that is an LO/4 mixing of the input signal.

Figure 3A:
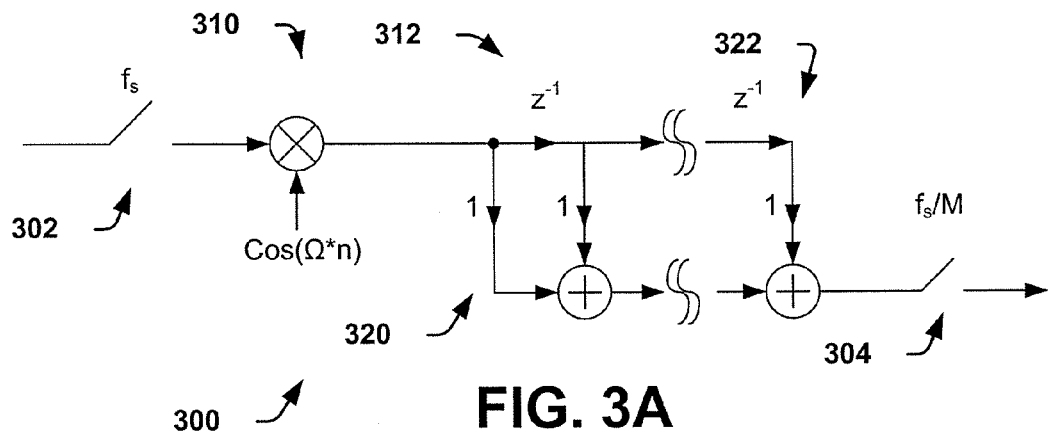
FIG. 3A is a diagram illustrating a mixing filter circuit with a separate mixer.

FIG. 3A is a diagram illustrating a mixing filter circuit 300 with a separate mixer. The circuit 300 provides a second discrete (complex) mixer directly after sampling. The circuit 300 introduces a time-variant FIR filter directly after the sampler.

The circuit 300 includes a sampler $f_s$, a separate mixer 310, a FIR filter 312, and an output 304. The sampler $f_s$ obtains samples of an incoming signal. The samples are mixed by the mixer 310 with a function to down-convert the signal. The mixer 110, in this example, mixes the incoming signal with cos (Ω*n). The down-converted signal is an output of the mixer 310 and is then received by the FIR filter 312.

The FIR filter 312 is an M tap filter in this example. Thus, the filter 312 has M branches or taps. A first branch is designated at 320 and an Mth branch is designated at 322.

There is a sequence of M−1 unit delays designated by $z^{-1}$ operators (in Z-transform notation). There are M filter coefficients or tap weights that makeup the impulse response of the filter 312. In this example, the filter coefficients are 1. An output for each tap is added to a previous tap output by an adder. Thus, an output signal is generated at $f_s/M$.

It is noted that appropriately setting the filter coefficients can permit omitting the mixer 310.

Figure 3B:
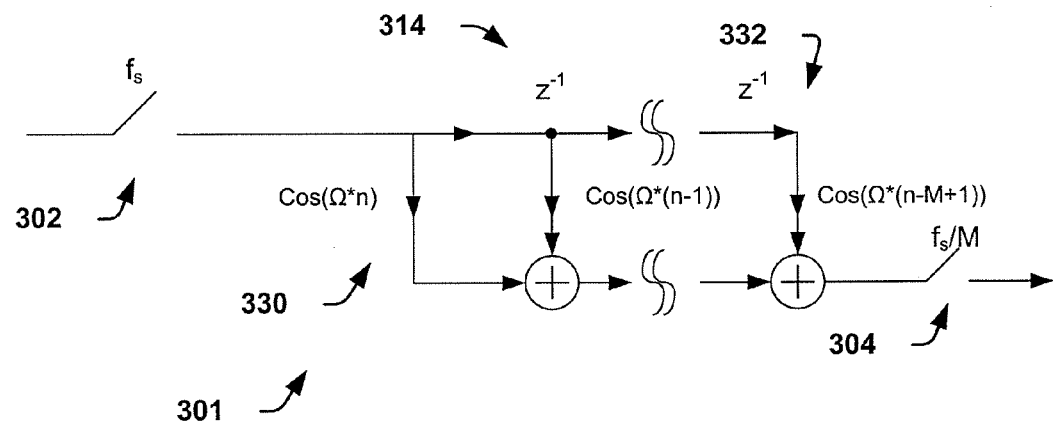
FIG. 3B is a diagram illustrating a mixing filter circuit in accordance with an embodiment of the invention.

FIG. 3B is a diagram illustrating a mixing filter circuit 301 in accordance with an embodiment of the invention. The circuit 301 also provides a second discrete (complex) mixer direction after sampling. However, the circuit 301 does not include or require a separate mixer coefficient. Arbitrary mixing can be obtained by appropriate selection of the filter coefficients.

The circuit 301 includes a sampler $f_s$, a FIR filter 314, and an output 304. The sampler $f_s$ obtains samples of an incoming signal. The samples need to be mixed with a function to down-convert the signal. In this example, the mixing function is cos (Ω*n) and is performed within the FIR filter 314.

The FIR filter 314 is an M tap filter in this example. Thus, the filter 314 has M branches or taps. A first branch is designated at 330 and an Mth branch is designated at 332 for a total of M branches.

There is a sequence of M−1 unit delays designated by $z^{-1}$ operators (in Z-transform notation). There are M filter coefficients or tap weights that makeup the impulse response of the filter 312. The filter coefficients are programmed or set to selected values to integrate the mixing functionality into the filter. An output for each tap is added to a previous tap output by an adder. Thus, an output signal is generated at $f_s/M$.

The filter coefficients are selected for each branch. The coefficient for the first branch is set to cos ($\Omega$*n). The coefficient for the second branch is programmed to cos ($\Omega$*(n−1)). Finally, the coefficient for the last or Mth branch is programmed to cos ($\Omega$*(n−M+1)). Following the same pattern, the remaining coefficients can be programmed.

Figure 4:
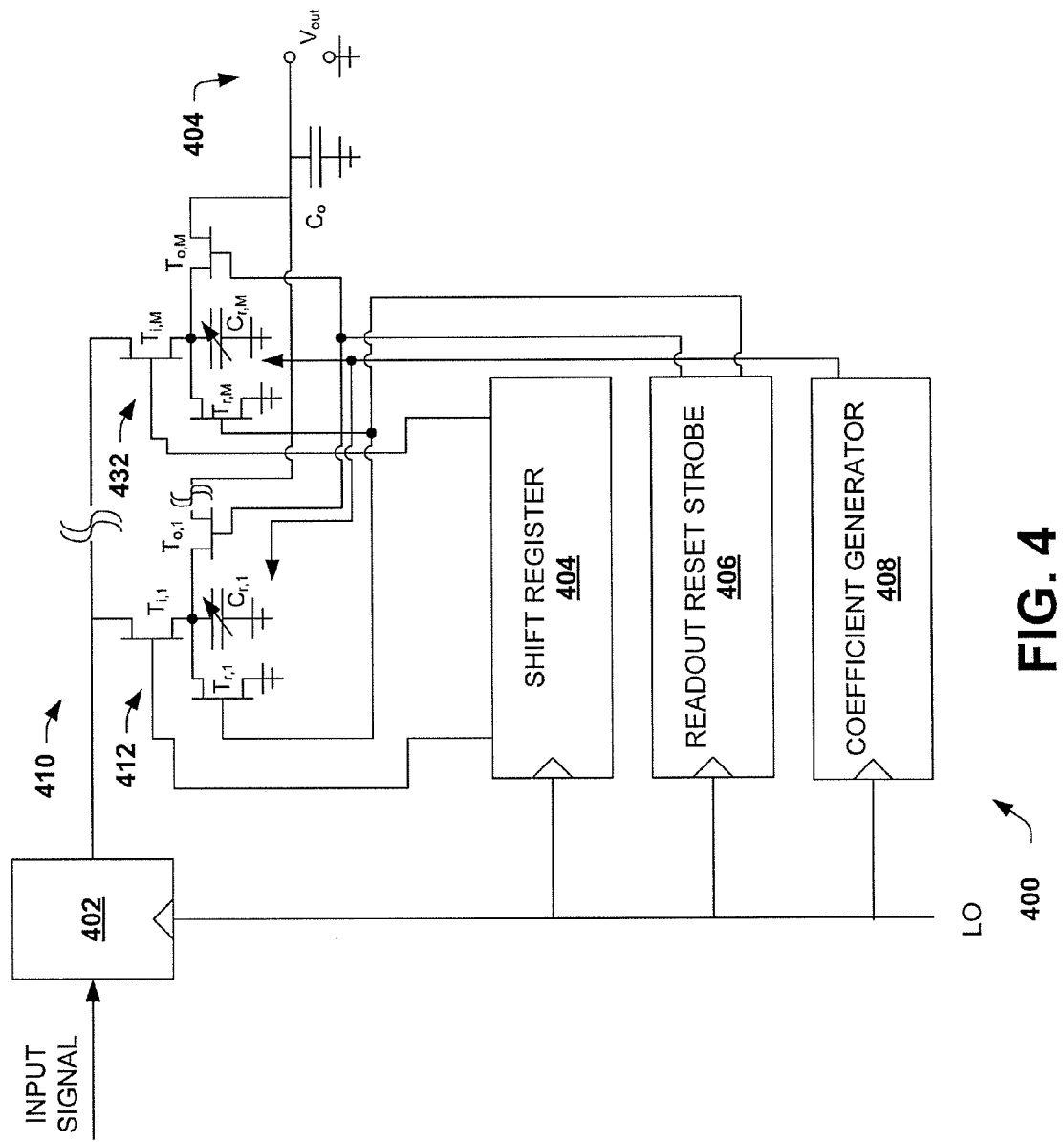
FIG. 4 is a circuit diagram illustrating a mixing filter circuit in accordance with an embodiment of the invention.

FIG. 4 is a circuit diagram illustrating a mixing filter circuit 400 in accordance with an embodiment of the invention. The circuit 400 is provided as an example of a suitable implementation of the mixer circuit 301 of FIG. 3B. The circuit 400 can be utilized for a sampling receiver with an inherent mixer functionality in the discrete time domain. The circuit 400 can be adapted and modified and still be in accordance with the invention.

The circuit 400 includes an input sampler 402, a shift register 404, a readout and reset strobe 406, a coefficient generator 408, a plurality of branches 410 and an output terminal 414. The plurality of branches 410 includes a configurable/selectable number of branches starting with a first branch 412 and ending with an Mth branch 432. As will be discussed below, each of the plurality of branches 410 are programmable.

The input sampler 402, the shift register 404, the strobe 406, and the coefficient generator 408 are clocked on a local oscillator signal (LO). The input sampler 402 samples the input signal according to the LO and provides samples to the plurality of branches 410. The shift register 404 provides shift signals to the branches 410. The strobe 406 provides strobe signals to the branches 410. The coefficient generator 408 generates and provides coefficients for each of the branches of the plurality of branches 410.

The plurality of branches 410 receive the samples in increasing unit delays. The plurality of branches 410 generate components of an output signal according to programmed filter coefficients. The components are added to generate the output signal.

The first branch 412 corresponds to the first branch 314 of FIG. 3B and receives the samples without delay and generates a first component of the output signal. The first branch 412 includes an input transistor $T_{i,1}$, a rotating transistor $T_{r,1}$, a rotating, programmable capacitor $C_{r,1}$ and an output transistor $T_{o,1}$. The programmable capacitor is adjusted or set by a coefficient signal from the coefficient generator 408. The shift signal is received by the input transistor. The strobe signals are provided to the rotating transistor and the output transistor.

The $M^{th}$ branch 432 corresponds to the $M^{th}$ branch of FIG. 3B and receives the samples and generates an $M^{th}$ component of the output signal. The $M^{th}$ branch 432 includes an input transistor $T_{i,M}$, a rotating transistor $T_{r,M}$, a rotating capacitor $C_{r,M}$ and an output transistor $T_{o,M}$. The programmable capacitor is adjusted or set by the coefficient signal from the coefficient generator. The shift signal is received by the input transistor. The strobe signals are provided to the rotating transistor and the output transistor.

The remaining branches of the plurality of branches 410 are configured in a similar manner. The branches 410 yield M components of the output signal that are added together to generate the output signal, which is provided at the output terminal 404. An output capacitor $C_o$ is connected to the output terminal 404.

The circuit 400 is shown with the coefficient generator 408 generating coefficients to yield the mixing shown in FIGS. 3A and 3B. It is appreciated that the coefficient generator 408 can generate and realize other mixing functions by adjusting the coefficients for the plurality of branches. Furthermore, it is appreciated that the coefficient generator 408 can alter the number of branches used by, for example, setting corresponding branch filter coefficients to values of zero or about zero. Thus, the coefficient generator 408 can vary the function and number of taps or branches to yield a selected filter and mixing functionalities. In fact, the ability or quality of the mixing achievable by the circuit 400 is only limited by the quantization of the realizable coefficients, which is not really limited.

The following provides an example of using a combined mixer filter circuit, such as circuit 400, in an FM radio receiver system. It is appreciated that mixer filter circuits of the invention can be utilized in a variety of systems, components, or receives. However, this example is provided to facilitate an understanding of the invention.

FM radio signals generally lie in the range between 76 and 108 MHz and are sampled at about 250 MHz. After sampling, the received sampled signal is down-converted with the filter mixer circuit 400. A decimation factor of 16 is used, which results in 16 branches being utilized. Thus, M=16. The output sample frequency is $f_s/M$=15.625 MHz.

The received, sampled signal is down-converted and decimated to a zero or low intermediate frequency (IF). The output capacitance Co is not reset between readouts, thus the system behaves as an IIR filter. One advantage of the system is that spur behavior is mitigated due to the fixed local oscillator (LO) signal.

Figure 5:
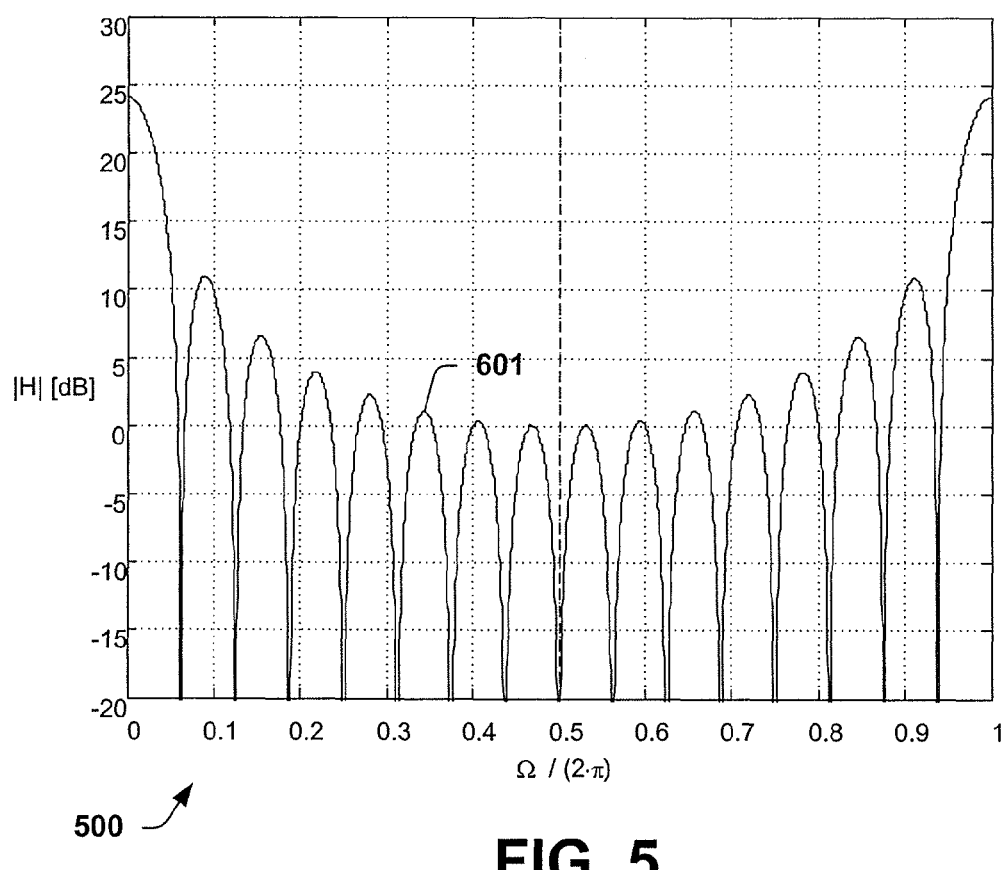
FIG. 5 is a graph illustrating a transfer function for a 16 tap FIR filter.

FIG. 5 is a graph 500 illustrating a transfer function for a 16 tap FIR filter. The transfer function is for a 16 tap moving average (MA) FIR filter and follows the above FM radio example. The filter does not include the mixing functionality integrated into the filter as described above. The input frequency is 250 MHz and the output sample frequency is $f_s/M$=15.625 MHz.

The graph 500 includes an x-axis and a y-axis. The x-axis depicts an input signal/frequency and the y-axis depicts frequency in dB. Line 501 depicts the response for the 16 tap FIR filter.

16 segments or portions of the transfer function can be seen. These correspond to the 16 taps in the filter. Further, attenuation can be seen for each segment of the transfer function.

Figure 6:
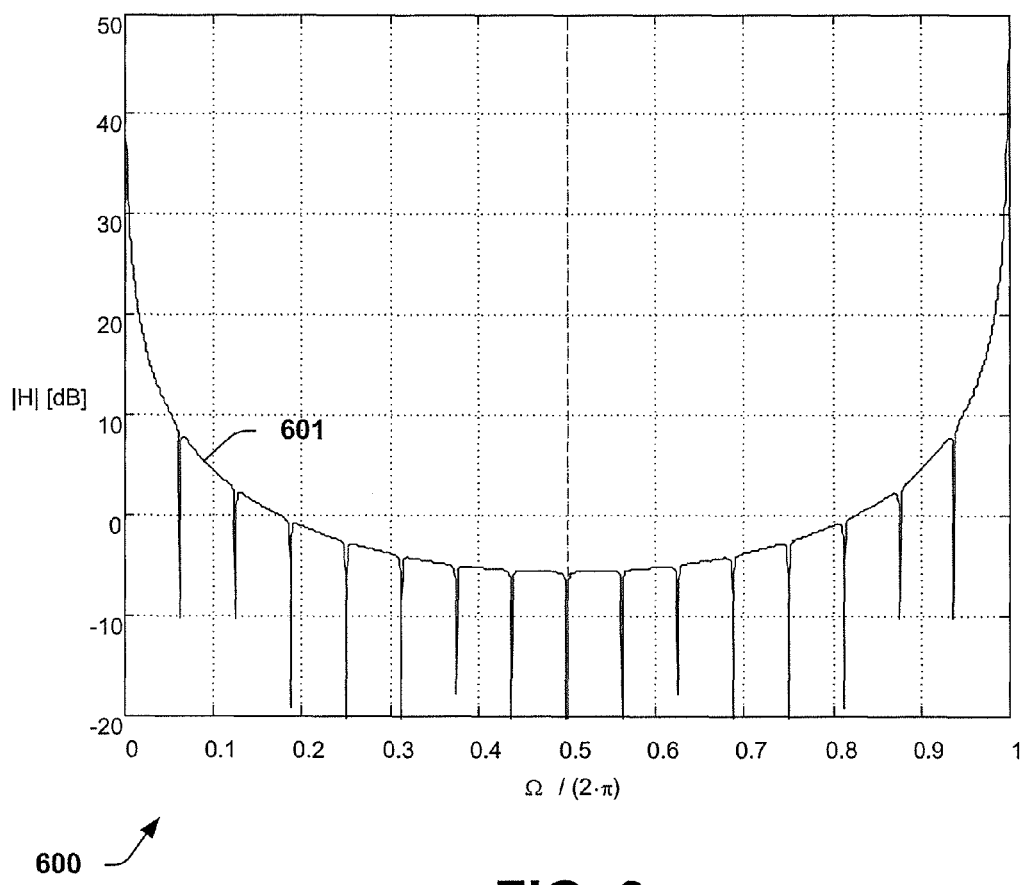
FIG. 6 is another graph illustrating a transfer function for a 16 tap FIR filter.

FIG. 6 is another graph 600 illustrating a transfer function for a 16 tap FIR filter. The FIR filter is a 16 tap MA FIR filter with final IIR filtering. The filter does not include the mixing functionality integrated into the filter as described above. The graph 600 includes an x-axis and a y-axis. The x-axis depicts an input signal/frequency and the y-axis depicts frequency in dB. Line 601 depicts the response for the 16 tap FIR filter.

Here, a feedback coefficient y is set to 11/12. Maximal attenuation at fs/2 is increased to approximately 50 dB. The transfer function shows a relatively narrow response with high attenuation. The overall bandwidth is about 200 kHz.

Figure 7:
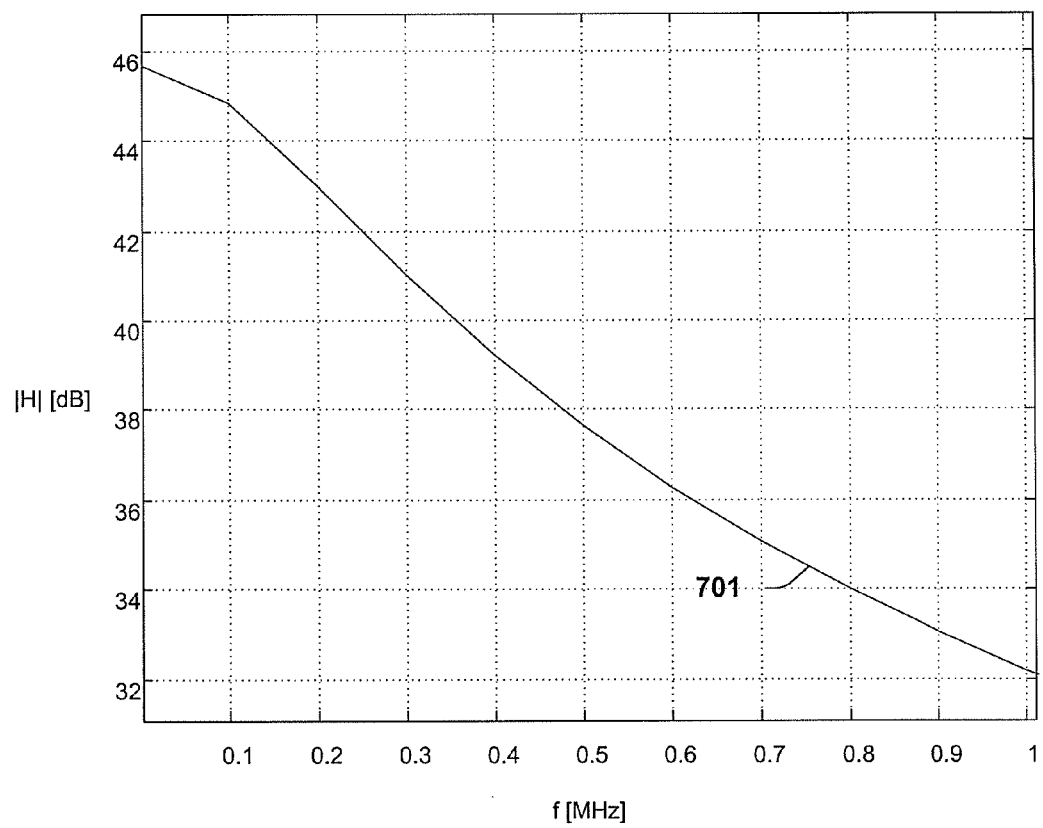
FIG. 7 is a graph illustrating a transfer function for a filter.

FIG. 7 is a graph 700 illustrating a transfer function for a filter. The filter here is a 16 tap MA FIR filter with final IIR filtering up to 1 MHz. The filter does not include the mixing functionality integrated into the filter described above. The graph 700 includes an x-axis and a y-axis. The x-axis depicts a frequency of up to 1 MHz. The y-axis depicts frequency in dB. Line 701 illustrates a response for the filter. The line 701 shows that the overall bandwidth is about 200 kHz.

Figure 8:
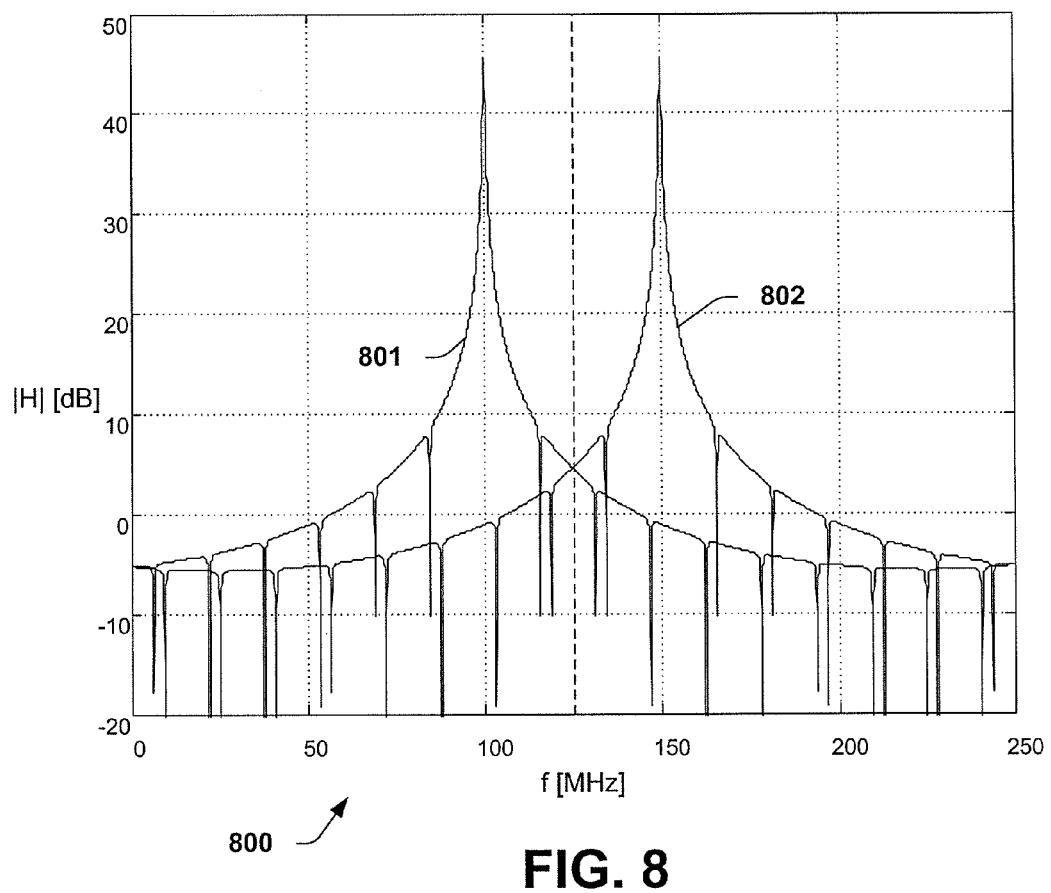
FIG. 8 is a graph illustrating a shifted transfer function for a FIR filter with integrated mixing.

FIG. 8 is a graph 800 illustrating a shifted transfer function for a FIR filter with integrated mixing. The FIR filter includes the mixing functionality into the filter, such as shown above in FIG. 4.

The graph 800 includes an x-axis and a y-axis. The x-axis illustrates frequency in MHz and the y-axis illustrates the response (H) in dB. A positive transfer function is indicated by line 801 and a negative transfer function is indicated by line 802.

By including or integrating the mixing functionality into the FIR filter, the transfer function can be shifted to an arbitrary or selected frequency as shown in the graph 800. The selected frequency is related to the input frequency. It is noted that the output frequencies of the passband translate to the DC frequency due to the decimation and the inherent mixing. The wanted channel is at 100 MHz, which corresponds to a peak of line 801. The positive function is also referred to as a wanted band and the negative function is also referred to as an image band. However, the image band results in an unwanted channel at 150 MHz. In order to obtain only the wanted channel and the wanted band, the image band needs to be removed. This image removal is referred to as image rejection.

The image band can be removed by adding a second path that performs the same filtering-mixing operation, but phase shifted, and adding the outputs.

Figure 9:
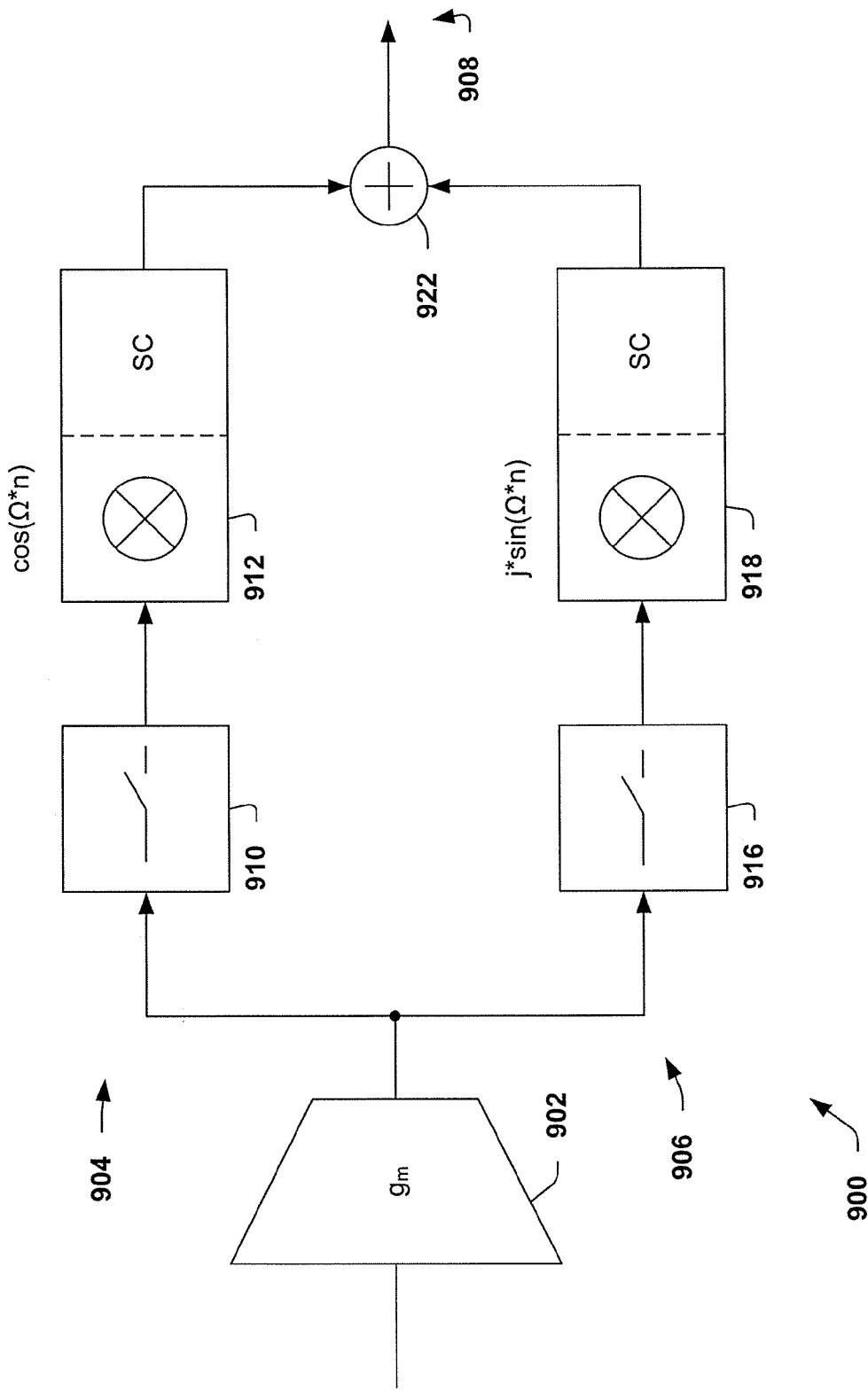
FIG. 9 is a block diagram of a receiver system in accordance with an embodiment of the invention.

FIG. 9 is a block diagram of a receiver system 900 in accordance with an embodiment of the invention. The system 900 includes combined filter-mixer components and image rejection.

The system 900 includes a receiver 902, a primary signal path 904, a secondary signal path 906, an adder 922 and an output 908. The receiver 902 provides the received signal to paths 904 and 906. The primary signal path 904 processes the received signal and generates a primary output signal, which is provided to the adder 922. The secondary signal path 906 also processes the received signal and generates a secondary output signal, which is also provided to the adder 922. The secondary signal path 906 introduces a selected delay.

The adder 922 adds the primary output signal to the secondary output signal and generates an output signal and the output 908. The primary output signal includes a wanted band, such as the positive function 801 of FIG. 8, and an image band, such as the negative function 802 of FIG. 8. The secondary output signal includes a phase shifted version of these bands. The adder 922 combines the primary output signal with the secondary output signal. As a result, the phase shifted bands of the secondary output signal reject or remove the image band from the output signal provided at the output 908.

The primary path 904 includes a primary sampler 910 and a primary combined filter-mixer 912. The primary sampler 910 samples the received signal at a selected sampling rate. For example, 250 MHz is used for FM radio. The sampled signal is provided to the primary combined filter 912 which performed filtering and mixing. The primary filter 912 includes a filter with selected coefficients to provide both mixing and filtering functions. Here, the mixing functionality is cos ($\Omega$*n). The circuit 400 described above is an example of a suitable filter in accordance with the invention. The output of the primary filter 912 is the primary output signal and is provided to the adder 922.

The secondary path 906 includes a secondary sampler 916 and a secondary combined filter-mixer 918. The secondary sampler 916 samples the received signal at a selected sampling rate. For example, 250 MHz is used for FM radio. The sampled signal is provided to the secondary combined filter 918 which performed filtering and mixing. The secondary filter 918 includes a filter with selected coefficients to provide both mixing and filtering functions. Here, the mixing functionality is j*sin ($\Omega$*n). This mixing includes multiplication by j which is obtained by incorporating an adequate delay of the received signal as it is a phase shift of $e^{j\pi/2}$. The circuit 400 described above is an example of a suitable filter in accordance with the invention. The output of the secondary filter 918 is the secondary output signal and is provided to the adder 922. As stated above, the phase shifted bands of the secondary output signal reject or remove the image band from the output signal provided at the output 908.

Figure 10:
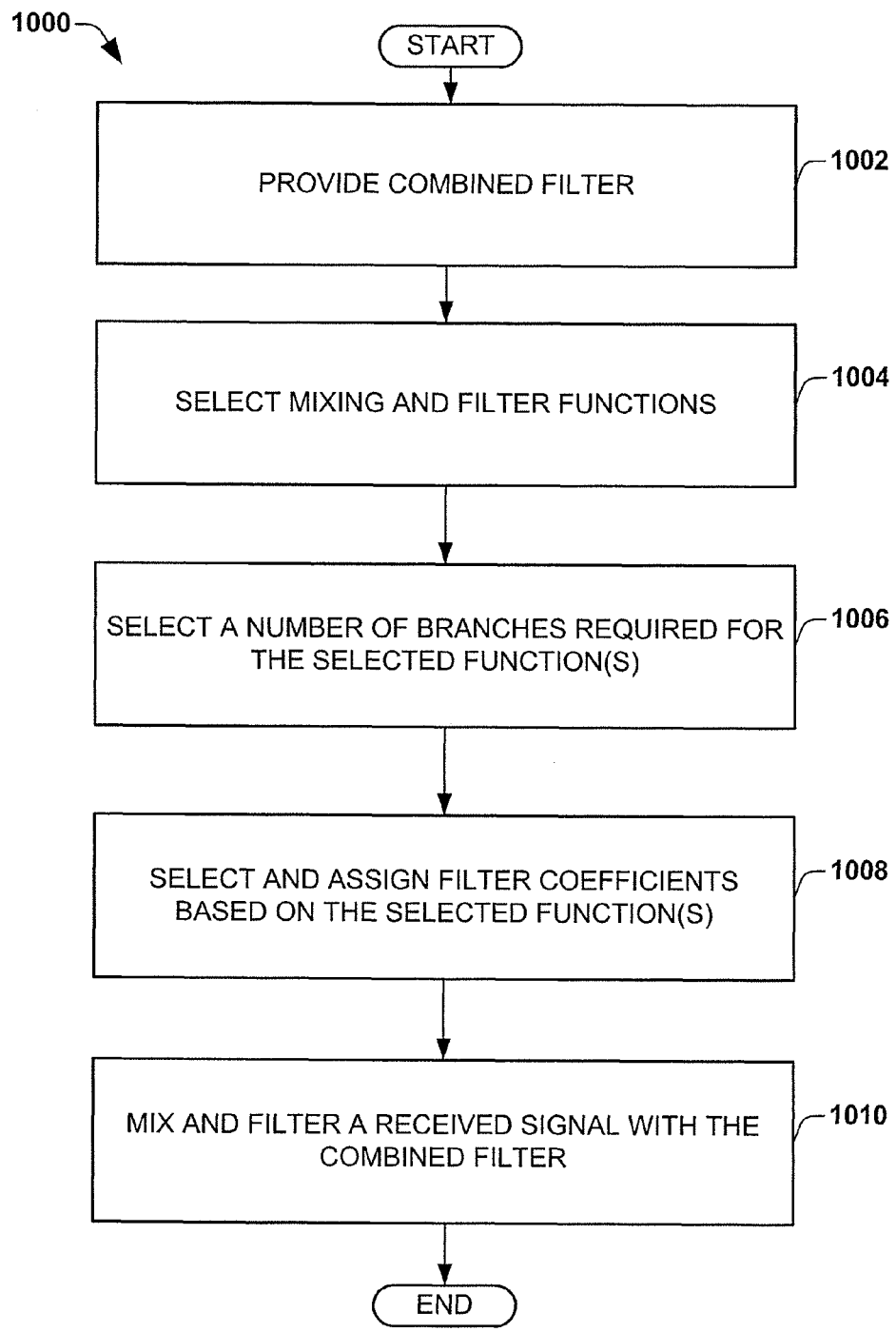
FIG. 10 is a flow diagram illustrating a method of filtering and mixing in accordance with an embodiment of the invention.

FIG. 10 is a flow diagram illustrating a method 1000 of filtering and mixing in accordance with an embodiment of the invention. The method 1000 performs mixing within a filter, such as a FIR filter, in order to mix (e.g., down-convert) an input signal while filtering. By performing the mixing within the filter, complexity can be reduced.

The method begins at block 1002, wherein a combined filter is provided. The filter includes mixing functionality, such as the filters/circuits described above (e.g., circuit 400). The filter is programmable in that the number of branches and/or filter coefficients for each branch can be modified in order to yield a selected or desired mixing function. In one example, branches include a programmable capacitor that is assignable to a value to obtain the filter coefficient for that branch. The branches can also include other components such as input transistors, rotating transistors, and output transistors.

A mixing function and a filter function are selected at block 1004. The mixing function corresponds to a desired output, such as shifting to a selected frequency band. The mixing function can include up-conversion or down-conversion. The filter function is also selected according to a desired output. Some of the factors considered can include input signal frequency, selected output frequency, sampling rate, noise rations, and the like.

A number of branches for the filter is selected at block 1006. The selection is typically based on the selected filter function. In one example, the number of branches is selected to be 4. In another example, the number of branches is selected to be 15.

Filter coefficients for the branches are selected and assigned at block 1008. The coefficients are selected according to the selected mixing function. It is appreciated that coefficients can be set to zero in order to essentially turn particular branches off.

The coefficients are assigned to the branches of the filter by a signal or programming. A coefficient generator can be present that determines and assigns the coefficients during operation. In one example, a coefficient generator programs a coefficient value to programmable capacitors of each branch.

A sampled signal is filtered and mixed by the combination filter at block 1010. The sampled signal is obtained by sampling a received signal at a specified sampling rate. In one example, the sampling is performed according to a local oscillator signal. The sampled signal is filtered according to the selected filter function by the combination filter. Additionally, the sampled signal is mixed according to the selected mixer function. The filtered and mixed signal is provided as an output signal.

Other operations can also be performed. In one example, an image band is removed from the output signal by generating a phase shifted signal and combining the phase shifted signal with the output signal to substantially remove the image band and leave the wanted band.

While the above method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

One embodiment of the present invention relates to a combined mixer filter circuit. The circuit includes a sampler, a plurality of filter branches, and a coefficient generator. The sampler is configured to provide a sampled signal by sampling a received signal at a specified rate. The plurality of filter branches has selectable filter coefficients. The filter branches are configured to receive the sampled signal and generate a mixed and filtered output signal without a separate mixer component. The coefficient generator is coupled to the plurality of filter branches. The coefficient generator is configured to assign filter coefficient values to the selectable filter coefficients to yield a selected mixing function for the mixed filtered output signal.

Another embodiment of the present invention relates to a receiver system. The system includes a receiver, a primary path, a secondary path, and an adder. The receiver is configured to provide a received signal. The primary path is configured to filter and mix the received signal and generate a primary output signal. The primary output signal can include a wanted band and an image band. The primary path includes a primary sampler and a primary combined filter. The primary combined filter performs both filtering and mixing. The secondary path is configured to filter and mix the received signal and to generate a secondary output signal. The secondary output signal can include a phase shifted band or reflected image. The secondary path includes a secondary sampler and a secondary combined filter. The adder combines the secondary output signal and the primary output signal to yield a combined output signal comprised substantially or only of the wanted band.

Another embodiment of the invention relates to a method of filtering and mixing using a combined mixer filter. A filter is provided that includes mixing functionality. The filter can be a FIR filter and include programmable filter coefficients for branches of the filter. A mixing function and a filter function are selected. A number of branches for the filter is selected or determined based on the selected filter function. Filter coefficients are assigned to the branches according to the selected mixing function. A received signal is then sampled and filtered to generate an output signal according to the selected mixing function and the selected filter function.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A combined mixer-filter circuit comprising:
a sampler configured to provide a sampled signal;
a plurality of filter branches having selectable filter coefficients, the plurality of filter branches configured to receive the sampled signal and generate a mixed and filtered output signal according to a selected filter function and a selected mixing function;
a coefficient generator coupled to the plurality of filter branches; and
wherein the coefficient generator is configured to assign and adjust filter coefficient values to the selectable filter coefficients during operation and according to the selected mixing function and wherein the plurality of filter branches each comprise an input transistor, , a programmable capacitor and an output transistor.

2. The circuit of claim 1, wherein the programmable capacitor of each of the plurality of branches is programmed by the coefficient generator.

3. The circuit of claim 1, wherein the plurality of branches include a unit delay or a rotating transistor.

4. The circuit of claim 1, wherein the filter coefficients include zero and non-zero values.

5. The circuit of claim 1, wherein the selected filter function is a moving average.

6. The circuit of claim 1, wherein the selected mixing function is given by $\cos(\Omega*n)$.

7. The circuit of claim 1, wherein the coefficient generator is configured to determine a number of the plurality of branches to be used.

8. The circuit of claim 1, wherein the number of the plurality of branches is determined by the filter function.

9. The circuit of claim 1, wherein the plurality of branches is a FIR filter.

10. The circuit of claim 1, further comprising a secondary path configured to generate a secondary signal and combine the secondary signal with the mixed filtered output signal to remove an image band from the mixed filtered output signal.

11. The circuit of claim 1, further comprising a shift register coupled to the plurality of branches.

12. The circuit of claim 11, wherein the shift register and the sampler operate on a local oscillator signal.

13. A receiver system comprising:
a receiver configured to provide a received signal;
a primary path configured to filter and mix the received signal and generate a primary output signal according to primary mixing and primary filtering, wherein the primary output signal includes a wanted band and an image band and the primary path includes a primary combined filter with primary selected coefficients to provide the primary mixing and the primary filtering;
a secondary path configured to filter and mix the received signal and generate a secondary output signal according to secondary mixing and secondary filtering, wherein the secondary output signal includes a phase shifted band and the secondary path includes a secondary combined filter with secondary selected coefficients to provide the secondary mixing and the secondary filtering and wherein the secondary mixing incorporates a delay associated with the phase shifted band; and
an adder configured to remove the image band of the primary output signal by the phase shifted band of the secondary output signal and generate a combined output signal comprised substantially of the wanted band.

14. The system of claim 13, wherein the primary path includes a primary sampler and a primary filter, wherein the primary filter is configured to perform a primary mixing function.

15. The system of claim 14, wherein the secondary path includes a secondary sampler and a secondary filter, wherein the secondary filter is configured to perform a secondary mixing function.

16. The system of claim 15, wherein the primary filter and the secondary filter are moving average finite impulse response filters.

17. A method of filtering and mixing, the method comprising:
   providing a filter that includes mixing functionality;
   selecting a mixing function and a filter function;
   selecting a number of branches for the filter based on the selected filter function, wherein the number of branches each comprise an input transistor, a programmable capacitor and an output transistor; and
   assigning and adjusting filter coefficients to the branches of the filter according to the selected mixing function by a coefficient generator during operation.

18. The method of claim 17, further comprising sampling a received signal and mixing and filtering the sampled signal with the filter to generate an output signal having the selected mixing function.

19. The method of claim 18, wherein the number of branches each further comprise a rotating transistor, or further comprising removing an image band from the output signal.

* * * * *